United States Patent
Cheng et al.

(10) Patent No.: US 10,508,969 B2
(45) Date of Patent: Dec. 17, 2019

(54) METHOD AND DEVICE FOR TESTING AIR TIGHTNESS

(71) Applicant: CHROMA ATE INC., Taoyuan (TW)

(72) Inventors: Po-Kai Cheng, Taoyuan (TW); Chang-Chi Yang, Taoyuan (TW); Chi-Shu Wang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 129 days.

(21) Appl. No.: 15/846,026

(22) Filed: Dec. 18, 2017

(65) Prior Publication Data

US 2018/0188132 A1    Jul. 5, 2018

(30) Foreign Application Priority Data

Dec. 30, 2016    (TW) .............................. 105144181 A

(51) Int. Cl.
| | |
|---|---|
| *G01M 3/32* | (2006.01) |
| *G01R 1/067* | (2006.01) |
| *G01R 31/26* | (2014.01) |
| *G01R 1/04* | (2006.01) |
| *G01R 31/28* | (2006.01) |

(52) U.S. Cl.
CPC ........ *G01M 3/3272* (2013.01); *G01M 3/3263* (2013.01); *G01M 3/3281* (2013.01); *G01R 1/06722* (2013.01); *G01R 31/2601* (2013.01); *G01R 1/0416* (2013.01); *G01R 31/2862* (2013.01); *G01R 31/2881* (2013.01)

(58) Field of Classification Search
CPC ............. G01M 3/3272; G01M 3/3263; G01M 3/3281; G01R 1/06722; G01R 1/0416; G01R 31/2601; G01R 31/2862; G01R 31/2881
See application file for complete search history.

(56) References Cited

U.S. PATENT DOCUMENTS

| | | | | |
|---|---|---|---|---|
| 2002/0182090 A1* | 12/2002 | Gray | ................... | F04B 43/0081 417/383 |
| 2003/0035087 A1* | 2/2003 | Murayama | .......... | G03F 7/70858 355/30 |

\* cited by examiner

*Primary Examiner* — David M. Gray
*Assistant Examiner* — Michael A Harrison
(74) *Attorney, Agent, or Firm* — Maschoff Brennan

(57) ABSTRACT

A method for testing air tightness includes connecting a testing chamber and a storage chamber, supplying negative pressure to the storage chamber, measuring the pressure in the storage or testing chamber to obtain a first pressure value, determining air tightness of the testing chamber according to the negative pressure and the first pressure value, stopping the negative pressure to the storage chamber, measuring the pressure in the storage chamber to obtain a second pressure value, measuring the pressure in the storage chamber after stopping the negative pressure to the storage chamber to obtain a third pressure value, and determining air tightness of the testing chamber according to the second and third pressure values. The device includes testing and storage chambers, a negative pressure generator, and a pressure gauge connected to the storage chamber, which is connected to the testing chamber. The negative pressure generator is connected to the storage chamber.

10 Claims, 3 Drawing Sheets

METHOD AND DEVICE FOR TESTING AIR TIGHTNESS

CROSS-REFERENCE TO RELATED APPLICATIONS

This non-provisional application claims priority under 35 U.S.C. § 119(a) on Patent Application No(s). 105144181 filed in Taiwan on Dec. 30, 2016, the entire contents of which are hereby incorporated by reference.

TECHNICAL FIELD

The disclosure relates to a testing method and a testing device, more particularly to a method and a device for testing air tightness.

BACKGROUND

In general, devices required to be air tight have to undergo an air tightness test during manufacturing process. For example, electronic devices have to undergo various electrical tests during the manufacturing process, and if a spring probe module assembled on the testing device is not assembled airtightly, it will affect the result of the electrical tests. Thus, the air tightness of the spring probe module should undergo an air tightness test before being assembled on the testing device.

SUMMARY

One embodiment of the disclosure provides a method for testing air tightness, comprising connecting a storage chamber and a testing chamber, supplying a negative pressure to the storage chamber, measuring a pressure in the storage chamber or the testing chamber to obtain a first pressure value, determining an air tightness of testing chamber according to the negative pressure and the first pressure value, stopping supplying the negative pressure to the storage chamber, measuring the pressure in the storage chamber or the testing chamber to obtain a second pressure value, measuring the pressure in the storage chamber or the testing chamber after stopping supplying the negative pressure to the storage chamber for a predetermined period of time to obtain a third pressure value, and determining the air tightness of the testing chamber according to the second pressure value and the third pressure value.

One embodiment of the disclosure provides a device for testing air tightness of an object. The device includes a testing chamber, a storage chamber, a negative pressure generator and at least one pressure gauge. The testing chamber is for accommodating the object. The storage chamber is connected to the testing chamber. The negative pressure generator is connected to the storage chamber and for supplying a negative pressure. The pressure gauge is connected to the storage chamber or the testing chamber, and is for measuring a pressure in the storage chamber or in the testing chamber.

BRIEF DESCRIPTION OF THE DRAWINGS

The present disclosure will become more fully understood from the detailed description given here in below and the accompanying drawings which are given by way of illustration only and thus are not intending to limit the present disclosure and wherein.

DETAILED DESCRIPTION

Figure 1:
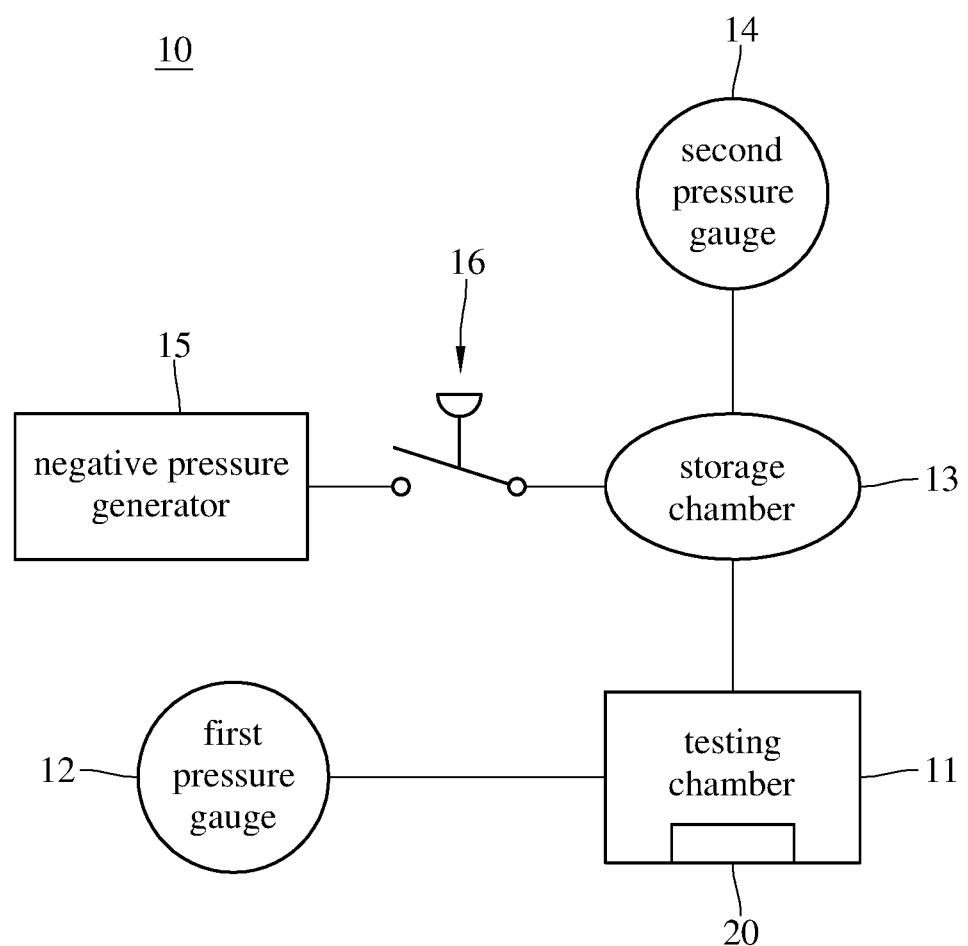
FIG. 1 is a block diagram of a device for testing air tightness accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
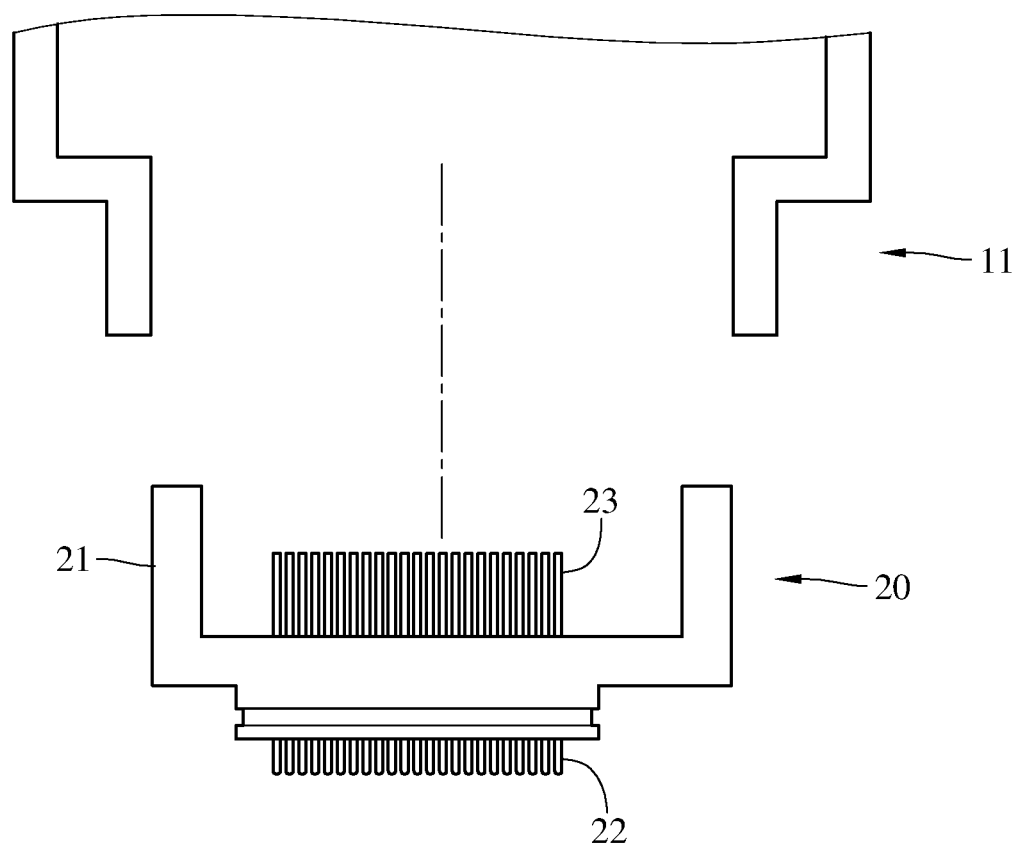
FIG. 2 is a side view of the device in FIG. 1 and an object to be tested.

Please refer to FIG. 1 and FIG. 2. FIG. 1 is a block diagram of a device for testing air tightness accordance with one embodiment of the disclosure. FIG. 2 is a side view of the device in FIG. 1 and an object to be tested. In this embodiment, a device 10, for testing air tightness, is provided. The device 10 includes a testing chamber 11, a first pressure gauge 12, a storage chamber 13, a second pressure gauge 14, a negative pressure generator 15 and a switch valve 16.

In this embodiment, an object 20 is provided to be tested, and it is airtightly disposed in the testing chamber 11. The object 20 is, for example, a spring probe module. The object 20 includes a base 21, a plurality of pins 22 and a plurality of sleeves 23. The pins 22, for example, are spring probes. The pins 22 penetrate through the base 21. The sleeves 23 are disposed on a side of the base 21, and are respectively sleeved on an end of the pins 22. The base 21 is disposed at an opening of the testing chamber 11. The connection of the pins 22 and the base 21 is required to be airtight.

The first pressure gauge 12 is connected to the testing chamber 11 for measuring pressure in the testing chamber 11. The storage chamber 13 is connected to the testing chamber 11. The second pressure gauge 14 is connected to the storage chamber 13 for measuring pressure in the storage chamber 13. The negative pressure generator 15 is connected to the storage chamber 13 for supplying a negative pressure to the storage chamber 13.

The switch valve 16 is located between the storage chamber 13 and the negative pressure generator 15 for controlling the connection between the storage chamber 13 and the negative pressure generator 15. In other words, when the switch valve 16 is turned on, the storage chamber 13 and the negative pressure generator 15 are connected to each other, and the pressure in the storage chamber 13 and the pressure in the testing chamber 11 are dynamically affected by the pressure in the negative pressure generator 15. On the other hand, when the switch valve 16 is turned off, the storage chamber 13 is closed, and the pressure in the storage chamber 13 and the pressure in the testing chamber 11 are relatively static.

Figure 3:
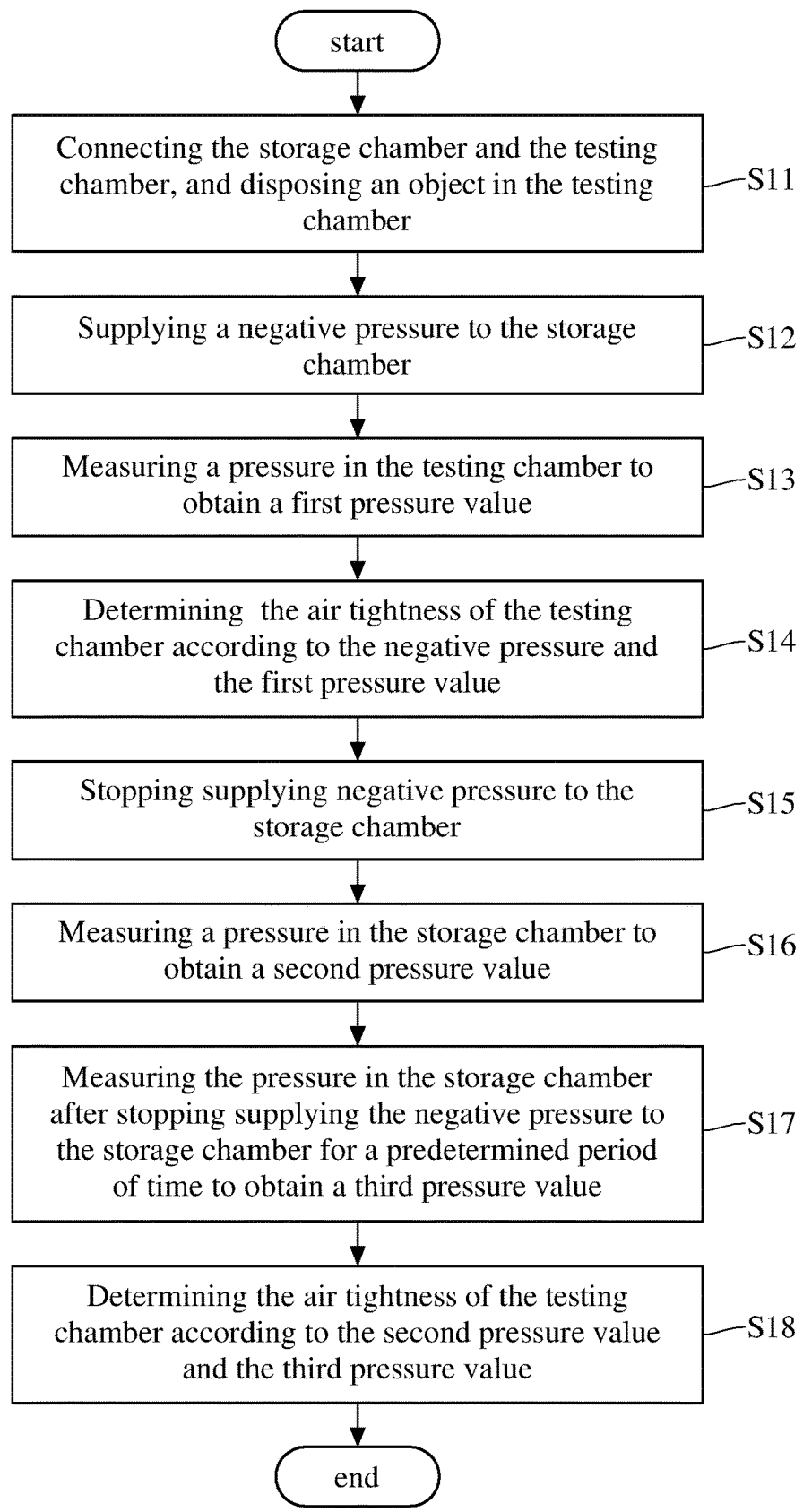
FIG. 3 is a flow chart of a method for testing air tightness in accordance with one embodiment of the disclosure.

Please further refer to FIG. 3, which is a flow chart of a method for testing air tightness in accordance with one embodiment of the disclosure. This embodiment provides a method for testing air tightness of the object 20.

The method includes the following steps.

At Step S11, the storage chamber 13 is connected to the testing chamber 11, and the object 20 is disposed in the testing chamber 11.

At Step S12, the negative pressure generator 15 and the switch valve 16 are both turned on to supply a negative pressure to the storage chamber 13. Since the testing chamber 11 is connected to the storage chamber 13, the negative pressure generator 15 also supplies the negative pressure to the testing chamber 11.

At step S13, the pressure in the testing chamber 11 is measured by the first pressure gauge 12 to obtain a first pressure value. The first pressure value is approximate the pressure in the object 20, but the present disclosure is not limited thereto. The first pressure value may be obtained by measuring the pressure in the storage chamber 13 through the second pressure gauge 14.

At step S14, the air tightness of the testing chamber 11 is determined according to the negative pressure and the first pressure value. In detail, the testing chamber 11 is determined leaking when an absolute difference between the negative pressure and the first pressure value is larger than a threshold value. The object 20 is airtightly disposed in the testing chamber 11, thus when the testing chamber 11 is determined leaking, the dynamic air tightness of the object 20 is regarded as disqualified, meaning that the object 20 is leaking. In contrast, the dynamic air tightness of the object 20 is regarded as qualified when the absolute difference is smaller than the threshold value. For example, when the absolute difference between the negative pressure and the first pressure value is smaller than or equal to 5 kPa, the dynamic air tightness of the object 20 is determined qualified. For another example, if the absolute difference between the negative pressure and the first pressure value is smaller than or equal to 5% of the negative pressure, the dynamic air tightness of the object 20 is determined qualified. However, the criterion of determining the air tightness is not limited thereto.

At Step S15, the negative pressure is stopped supplying to the storage chamber 13 and the testing chamber 11 by, for example, turning off the switch valve 16 or turning off the negative pressure generator 15, or turning off both the switch valve 16 and the negative pressure generator 15.

At step S16, the pressure in the storage chamber 13 is measured by the second pressure gauge 14 so as to obtain a second pressure value. The pressure in the storage chamber 13 could be relatively static than the pressure in the testing chamber 11, but the present disclosure is not limited thereto. The second pressure value may be obtained by measuring the pressure in the testing chamber 11 by the first pressure gauge 12.

At step S17, the pressure in the storage chamber 13 is measured to obtain a third pressure value after the negative pressure generator 15 not supplying the negative pressure to the storage chamber 13 for a predetermined period of time. The predetermined period of time is about 60 seconds. The pressure in the storage chamber 13 is relatively static than the pressure in the testing chamber 11, but the present disclosure is not limited thereto. The third pressure value may be obtained by measuring the pressure in the testing chamber 11 through the first pressure gauge 12.

At step S18, the air tightness of the testing chamber 11 is determined according to the second pressure value and the third pressure value. In detail, when an absolute difference between the second pressure value and the third pressure value is larger than a threshold value, the testing chamber 11 is determined leaking. The object 20 is airtightly disposed in the testing chamber 11, thus when the testing chamber 11 is determined leaking, the static air tightness of the object 20 is determined unqualified. For example, if the absolute difference between the second pressure value and the third pressure value is smaller than or equal to 5 kPa, the static air tightness of the object 20 is determined qualified. For another example, if the absolute difference between the second pressure value and the third pressure value is smaller than or equal to the 5% of the negative pressure, the static air tightness of the object 20 is determined qualified. However, the criterion of determining the air tightness is not limited thereto.

According to the method and the device for testing air tightness discussed above, the pressure of the storage chamber is measured, while being supplied with the negative pressure, when just stopping supplying the negative pressure, and after a predetermined period of time not supplying the negative pressure; that is, the air tightness test is performed under static and dynamic conditions, thus the result of the air tightness test for the object could be accurate.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A method for testing air tightness, comprising:
airtightnessly disposing an object at an opening of a testing chamber;
connecting a storage chamber and the testing chamber;
supplying a negative pressure to the storage chamber;
measuring a pressure in the storage chamber or the testing chamber to obtain a first pressure value;
determining an air tightness of the testing chamber according to the negative pressure and the first pressure value;
stopping supplying the negative pressure to the storage chamber;
measuring the pressure in the storage chamber or the testing chamber to obtain a second pressure value;
measuring the pressure in the storage chamber or the testing chamber after stopping supplying the negative pressure to the storage chamber for a predetermined period of time to obtain a third pressure value; and
determining the air tightness of the testing chamber according to the second pressure value and the third pressure value.

2. The method according to claim 1, wherein the testing chamber is determined leaking when an absolute difference between the negative pressure and the first pressure value is larger than a threshold value.

3. The method according to claim 1, wherein a dynamic air tightness of the testing chamber is determined qualified when an absolute difference between the negative pressure and the first pressure value is less than or equal to 5 kPa.

4. The method according to claim 1, wherein a dynamic air tightness of the testing chamber is determined qualified when an absolute difference between the negative pressure and the first pressure value is smaller than or equal to 5% of the negative pressure.

5. The method according to claim 1, wherein the testing chamber is determined leaking when an absolute difference between the second pressure value and the third pressure value is larger than a threshold value.

6. The method according to claim 1, wherein a static air tightness of the testing chamber is determined qualified when an absolute difference between the second pressure value and the third pressure value is smaller than or equal to 5 kPa.

7. The method according to claim 1, wherein a static air tightness of the testing chamber is determined qualified when an absolute difference between the second pressure value and the third pressure value is smaller than or equal to 5% of the second pressure value.

8. The method according to claim 1, wherein the step of stopping supplying the negative pressure to the storage chamber comprises turning off a switch valve connected between a negative pressure generator and the storage chamber, or turning off the negative pressure generator, or turning off both the switch valve and the negative pressure generator.

9. A device for testing air tightness of an object, the device comprising:
- a testing chamber, having an opening for the object to be airtightnessly disposed at the testing chamber;
- a storage chamber, connected to the testing chamber;
- a negative pressure generator, connected to the storage chamber, and for supplying a negative pressure; and
- at least one pressure gauge, connected to the storage chamber or the testing chamber, and for measuring a pressure in the storage chamber or the testing chamber.

10. The device according to claim 9, further comprising a switch valve located between the storage chamber and the negative pressure generator for controlling the connection between the storage chamber and the negative pressure generator.

\* \* \* \* \*